United States Patent
Grasso et al.

(10) Patent No.: US 9,438,463 B2
(45) Date of Patent: Sep. 6, 2016

(54) SYSTEM FOR THE CORRECTION OF AMPLITUDE AND PHASE ERRORS OF IN-QUADRATURE SIGNALS, CORRESPONDING RECEIVER AND METHOD

(71) Applicant: STMICROELECTRONICS S.R.L., Agrate Brianza (IT)

(72) Inventors: Leandro Grasso, Sortino (IT); Ranieri Guerra, S. Giovanni la Punta (IT); Giuseppe Palmisano, S. Giovanni la Punta (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/751,339

(22) Filed: Jun. 26, 2015

(65) Prior Publication Data

US 2016/0094379 A1    Mar. 31, 2016

(30) Foreign Application Priority Data

Sep. 25, 2014   (IT) .............................. TO2014A0758

(51) Int. Cl.
*H04B 1/12*       (2006.01)
*H04L 27/38*     (2006.01)
(Continued)

(52) U.S. Cl.
CPC ........... *H04L 27/3836* (2013.01); *G06F 17/10* (2013.01); *H03D 3/009* (2013.01); *H04L 27/0014* (2013.01); *H04L 27/3863* (2013.01); *H04L 2027/003* (2013.01)

(58) Field of Classification Search
CPC .......... H03D 3/009; H04L 2027/0024; H04L 2027/0038; H04L 25/0276; H04L 27/01; H04L 27/364; H04L 27/366

USPC ................................. 375/320, 346, 349, 350
See application file for complete search history.

(56) References Cited

U.S. PATENT DOCUMENTS

| 7,570,710 B1 | 8/2009 | Fortier et al. |
| 2009/0003614 A1* | 1/2009 | Neunaber ............... H04S 1/002 381/63 |

(Continued)

FOREIGN PATENT DOCUMENTS

| WO | 2013005203 A1 | 1/2013 |
| WO | 2014058752 A2 | 4/2014 |

OTHER PUBLICATIONS

McGwier, "On a Method for Automatic Image Balancing in IQ Mixer Based Software Defined Receivers," Digital Communications Conference, 2007, pp. 81-90.

(Continued)

*Primary Examiner* — David S Huang
(74) *Attorney, Agent, or Firm* — Allen, Dyer, Doppelt, Milbrath & Gilchrist, P.A.

(57) ABSTRACT

A system may be for the correction of phase and amplitude errors. The system may receive a first input signal and a second input signal and supply a first output signal and a second output signal. The system may include two adders that supply the first and second output signals, respectively. The two adders may be configured for computing a sum of the first and second input signals, and multiplying the weighted sum by a third coefficient. Moreover, the first coefficient or the second coefficient of the first adder may be variable to enable correction of the phase errors, and the third coefficient of the second adder may be variable to enable correction of the amplitude errors.

21 Claims, 12 Drawing Sheets

(51) Int. Cl.
*G06F 17/10* (2006.01)
*H04L 27/00* (2006.01)
*H03D 3/00* (2006.01)

(56) References Cited

U.S. PATENT DOCUMENTS

2010/0104045 A1   4/2010   Santraine et al.
2012/0256673 A1*  10/2012  Fujibayashi .......... H04L 27/366
                                                    327/238

OTHER PUBLICATIONS

McGwier, IQ Gain and Phase Correction VHDL Filter Based on MATLAB Model, May 18, 2011, pp. 1-21.
Yu et al., "A Novel Adaptive Mismatch Cancellation System for Quadrature IF Radio Receivers," IEEE Transactions on Circuits and Systems—II: Analog and Digital Signal Processing, vol. 46, No. 6, Jun. 1999, pp. 789-801.
Steila, "Automatic In-phase Quadrature Balancing AIQB," Oct. 2006, pp. 1-9.

* cited by examiner

SYSTEM FOR THE CORRECTION OF AMPLITUDE AND PHASE ERRORS OF IN-QUADRATURE SIGNALS, CORRESPONDING RECEIVER AND METHOD

RELATED APPLICATION

This application is based upon prior filed copending Italian Application No. TO2014A000758 filed Sep. 25, 2014, the entire subject matter of which is incorporated herein by reference in its entirety.

TECHNICAL FIELD

The present disclosure relates to correction of amplitude and phase errors of in-phase quadrature signals (I/Q) received by a wireless receiver.

BACKGROUND

FIG. 1 shows a block diagram of a generic wireless transceiver, in which a processing circuit 10, such as, for example, a digital signal processor (DSP), supplies a baseband (BB) transmitting signal TXBB. The above baseband transmitting signal TXBB is converted by a transmitter circuit 20 into a RF transmitting signal TXRF. For instance, typically the transmitter circuit 20 comprises a modulator, such as, for example, a mixer or an analog multiplier, which modulates the signal TXBB with a high-frequency carrier signal LO. In addition, the transmitter circuit may also comprise filters, amplifiers, etc. Finally, the transmitting signal TXRF is sent to at least one antenna 30.

In a complementary way, an RF receiving signal RXRF received via the antenna 30 is converted via a receiver circuit 40 into a baseband receiving signal RXBB. For instance, typically the receiver circuit 40 comprises a demodulator, such as, for example, a mixer, which demodulates the signal RXRF using the carrier frequency LO. Also, the receiver circuit may comprise filters, amplifiers, etc. For instance, the carrier signal LO may be supplied by an oscillator or synthesizer 50.

A particular architecture of the receiver 40 is the architecture of a so-called "low-IF" type. Basically, in a low-IF receiver, the RF signal RXRF received is demodulated at a lower, non-zero, frequency, the so-called "intermediate frequency" (IF), which typically ranges from hundreds of kilohertz (kHz) to some megahertz (MHz).

Receivers with a low-IF architecture are commonly used in transceiver systems on account of their relatively low complexity and robustness. The main characteristic of this architecture is the fact that the RF signal RXRF received is converted by means of a system of a heterodyne type to a significantly lower frequency, hereinafter designated by fIF. In particular, the heterodyne system is implemented through a mixer that carries out multiplication of the RF signal by an ideally pure tone (LO) with frequency fLO, appropriately generated by the synthesizer 50 in such a way that:

$$f_{IF} = f_{RF} - f_{LO}. \quad (1)$$

The high-frequency components generated by the multiplication can be subsequently filtered along the receiving chain.

The choice of the frequency fIF has a considerable effect on the design of the analog system in so far as, if it is sufficiently high, it enables reduction of the problems of flicker noise and DC offsets generated by the chain of receiver circuits. On the other hand, an excessive increase of the frequency fIF may lead to an increase of the power dissipation of the analog-to-digital converter (ADC) and also of the DSP in so far as it requires a higher working frequency.

Low-IF receivers normally use in-phase quadrature signals (i.e., of a complex-envelope type) both to facilitate demodulation thereof and to solve the problem of image rejection. The in-phase quadrature signals are periodic waveforms that have a phase difference equal to one quarter of their period, namely, 90°. Consequently, as highlighted in FIG. 2, the low-IF receiver circuit 40 receives at input the RF receiving signal RXRF. In this example, the signal RXRF is amplified via an amplifier 402, such as, for example, a low-noise amplifier (LNA).

In particular, in the case where the receiver 40 operates with signals I and Q that are in quadrature with respect to one another, the amplified signal, i.e., the signal at output from the amplifier 402, is sent to two branches: a first branch for the in-phase (I) component, and a second branch for the quadrature (Q) component. In this case, each branch comprises a demodulator 404, such as, for example, a mixer, which carries out multiplication of the RF signal by respective signals LOI and LOQ, and a filter 406, which, by filtering the high-frequency components, yields the evolution in time of the respective component IRX and QRX.

To interface those signals with the processing circuit 10, respective analog-to-digital (A/D) converters 408 may be provided. Consequently, reception of a complex signal calls for generation, upstream, of the in-phase signal LOI and the quadrature signal LOQ, i.e., having a phase shift of 90° with respect to one another. Generation of the tones LOI and LOQ with controlled phase shift calls for an accurate design of the circuit 50 that will limit as far as possible the inevitable cumulative phase errors.

The techniques normally employed envision use of an oscillator inserted in a phase-locked loop (PLL), where the oscillator may, for example, be a voltage-controlled oscillator (VCO) 502, and multiphase filters or frequency dividers 504; the latter approach, however, envisions generation of a tone by the synthesizer, the frequency of which should be at least twice the desired one. Against this disadvantage, the active division circuit enables introduction of techniques for control of the phase error that can also compensate for possible phase errors accumulated in the receiving chain.

The precision on the amplitude and phase of the in-phase quadrature signals I and Q may be important in RF communication systems that adopt in reception of the low-IF architecture, since it affects the levels of performance of the receiver. The low-IF architecture, which yields benefits from the standpoint of offset and flicker noise, presents in fact an image signal that may be very close to the channel of interest and that hence may require use of two in-phase quadrature signals for implementing rejection of the image signal.

A typical problem of the low-IF receiver may include so-called "image response or rejection." With reference to FIG. 3a, the problem may include the fact that a generic heterodyne system produces a frequency conversion both of the desired channel CHN. In this case, this is at a frequency fCHN=fLO+fIF, and of its image IMG positioned at fIMG=fLO−fIF, which at this point can hardly be rejected with a classic real analog filter, such as, for example, the filter 406, in so far as both of the channels are brought to the frequency fIF, since the components CHN and IMG come to be superimposed during demodulation in the demodulators 404 (see FIG. 3b).

Selection of the channel CHN may in any case be made by complex-filtering techniques, which can be implemented either in an analog or in a digital way and operate on the complex (in-phase quadrature) signal received by selecting the desired channel CHN from the image IMG and from other possible out-of-band interfering signals. The effectiveness of the complex filter in rejection of the image IMG is, however, markedly affected by the phase and amplitude mismatch or errors that accumulate on the in-phase quadrature signals at input, where the phase mismatch is defined as the deviation with respect to the 90° phase shift expected between the signals I and Q, and the amplitude mismatch is defined as the lack of amplitude correspondence between the signals I and Q. The image-rejection ratio is described, for example, in the paper by Q. Gu, "RF System Design of Transceivers for Wireless Communications," New Work, USA, Springer, 2005 (Gu reference).

For example, FIG. 4, which is disclosed in the Gu reference, shows a typical relation for image rejection (IR) with respect to the phase mismatch, or "Phase Imbalance", as appears on the horizontal axis, and the amplitude mismatch, or "Amplitude Imbalance," as appears on the vertical axis. The errors of the in-phase quadrature signals I and Q are correlated to the image-rejection (IR) ratio. The relation that expresses the image rejection IR with respect to the phase mismatch $\phi$ and the amplitude mismatch $\delta$ may be expressed via the following equation:

$$IR = 10\log\frac{1 + 2(1+\delta)\cos\varphi + (1+\delta)^2}{1 - 2(1+\delta)\cos\varphi + (1+\delta)^2}; \quad (2)$$

where $\delta$ is the amplitude error (expressed in decibels) and $\phi$ is the phase error with respect to the ideal 90° phase shift between the two signals I and Q. Consequently, normal techniques of correction of the errors are introduced in such a way as to maximize the image rejection that can be obtained in accordance with the specifications of the system and with the effective selectivity of the complex filter.

For instance, the technique described in Li Yu, W. Martin Snelgrove, "A Novel Adaptive Mismatch Cancellation System for Quadrature IF Radio Receivers", IEEE TRANSACTIONS ON CIRCUITS AND SYSTEMS—II: ANALOG AND DIGITAL SIGNAL PROCESSING, VOL. 46, NO. 6, JUNE 1999, is a known technique because it operates digitally on the complex signal received, producing a simultaneous correction of amplitude and phase mismatch prior to complex filtering.

Alternatively, the technique described in Oscar Stella. "Automatic In-phase Quadrature Balancing AIQB," October 2006 (Rev C: Jul. 10, 2012) may be used, where a mismatch correction is made by correlating appropriately different harmonic contributions of the signal received. This approach calls, however, for an operation of a Fast Fourier Transform (FFT), which is typically more burdensome from the computational standpoint.

However, the increasing demand for low-consumption systems clashes with producing high-performance ADC circuits, which in general prove particularly burdensome from the consumption standpoint and frequently force the digital circuitry to operate at higher sampling frequencies, thus weighing even more heavily on the power budget. Optimization of the circuits and appropriate distribution of the functions linked to selection of the channel CHN within the low-IF architecture may, however, contribute significantly to the reduction of the overall consumption of the system, reducing in particular the performance required of the ADC and the digital circuitry.

In this sense, the architecture proposed in FIG. 5 includes a complex filter 412 of an analog type upstream of the A/D conversion. The complex filter 412 is ideally able to select the desired channel CHN from any other interfering channel (including the image IMG), intrinsically limiting the band requirement and the resolution of the ADC and hence also the consumption of the processing unit 10.

Elimination of the image channel IMG, moreover, enables for some specific modulation formats demodulation of the channel received without necessarily having a complex signal, and consequently it is possible to eliminate also one of the two A/D converters 408. Against the advantages set forth there may remain the problem of correction of the phase and amplitude errors at input to the complex filter 412, since in the presence of the filter and of an A/D converter of limited performance it may not be possible to use the techniques proposed by Li Yu and Oscar Steila.

In the example of FIG. 5, the correction is made upstream of the complex filter 412, by appropriately acting on the frequency dividers present within the generator 50, for example, in the circuit 504, and on the amplitude error at the baseband level, for example, by adding a respective amplifier with configurable amplification coefficient 410, for example, between the filter 406 and the filter 412. There may also exist different approaches that envision making the correction of both of the errors by acting only on the I/Q components received at IF frequency.

SUMMARY

A system may comprise two adders, which supply, respectively, the first and second output signals. In some embodiments, the two adders are configured for computing a weighted sum of the first and second input signals. Specifically, the sum is weighted via a respective first coefficient and a respective second coefficient, and the weighted sum is multiplied by a third coefficient. In particular, the ratios between the first and second coefficients and the third coefficient define the weighting coefficients with which the first and second input signals are added together.

In the system for the correction of phase and amplitude errors described, the first and second coefficients (or only one of the two) of the first adder are variable in order to enable correction of the phase errors, and the third coefficient of the second adder is variable in order to enable correction of the amplitude errors. In some embodiments, each of the two adders may be obtained with an operational amplifier in inverting mode. In some additional embodiments, the first, second, and third coefficients are set via resistors. In alternative embodiments, the first, second, and third coefficients are set via capacitors according to the switched-capacitor technique.

Optionally, the first input signal is a differential signal supplied through two terminals, and the second input signal is a differential signal supplied through two terminals. Consequently, the output signal supplied by the operational amplifier is made available through two terminals. The first signal at input to the system may be an in-phase signal, and the second signal at input to the system may be a quadrature signal. Also, the first and second input signals may be baseband signals.

In some embodiments, for the first adder, only one between the first and second coefficients is variable, and the other coefficient and the third coefficient are fixed, in such a way as to generate a variable phase shift in terms of phase correction and a fixed amplitude correction. For the second adder, only the third coefficient is variable, and the first and second coefficients are fixed, in such a way as to generate a fixed phase shift in terms of phase correction and a variable amplitude correction. Consequently, various embodiments for correction of the errors described herein make it possible to obtain a high image rejection and may be used, for example, in receivers of RF front-ends.

In some embodiments, the error-correction technique proposed may enable integration in a compact way of phase correction and amplitude correction, moreover offering a series of additional degrees of freedom useful for adapting the output to the error range expected and to its possible lack of symmetry. Also, correction of the errors in in-phase quadrature signals may enable a circuit implementation providing both a lower power consumption and a reduced area occupation. In particular, the error-correction technique described herein enables saving in power consumption since it affords a circuit implementation with only two operational amplifiers, one for each branch I and Q. Furthermore, the technique described herein enables saving in area occupation since it affords a compact circuit implementation in terms of complexity and number of variable components required, at the same time providing a high precision both in terms of phase and in terms of amplitude, enabling a very high image rejection. The error-correction technique described herein may enable a phase correction to be obtained through gain factors that are not excessively small and a low input complexity.

DETAILED DESCRIPTION

In the ensuing description, various specific details are illustrated aimed at providing an in-depth understanding of examples of one or more embodiments. The embodiments may be obtained without one or more of the specific details, or with other methods, components, materials, etc. In other cases, known structures, materials, or operations are not illustrated or described in detail so that various aspects of the embodiments will not be obscured. Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to the same embodiment. Furthermore, particular conformations, structures, or characteristics may be combined in any adequate way in one or more embodiments. The references used herein are provided merely for convenience and hence do not define the sphere of protection or the scope of the embodiments.

As mentioned previously, the present disclosure provides approaches for correction of amplitude and phase errors in in-phase quadrature signals normally available within a receiver of the low-IF type. In various embodiments, the technique disclosed moreover presents a high rejection of the image component of the signals.

Figure 6A:
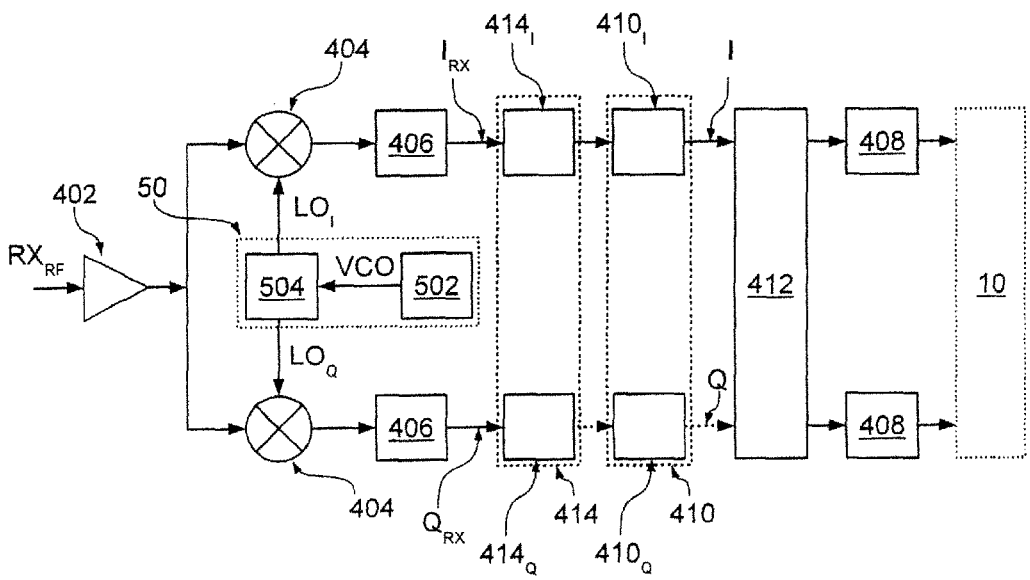
FIGS. 6a and 6b are schematic block diagrams of embodiments of a receiver.

FIG. 6a shows a possible embodiment of a receiver, in which it is possible to separate the phase correction from the amplitude correction, in particular, by providing downstream of the filter 406 a block 414 for phase correction and, cascaded thereto, a block 410 for amplitude correction. In various embodiments, the phase-correction block 414 comprises two sub-blocks 414I and 414Q, one for each I and Q input branch. Furthermore, in this embodiment also, the amplitude-correction block 414 comprises two sub-blocks 410I and 410Q, one for each I and Q input branch. In particular, each sub-block 410I and 410Q may be implemented, for example, via a respective amplifier with a configurable amplification coefficient. These sub-blocks 410I and 410Q are set, for example, between the block 414 and the filter 412.

Figure 6B:
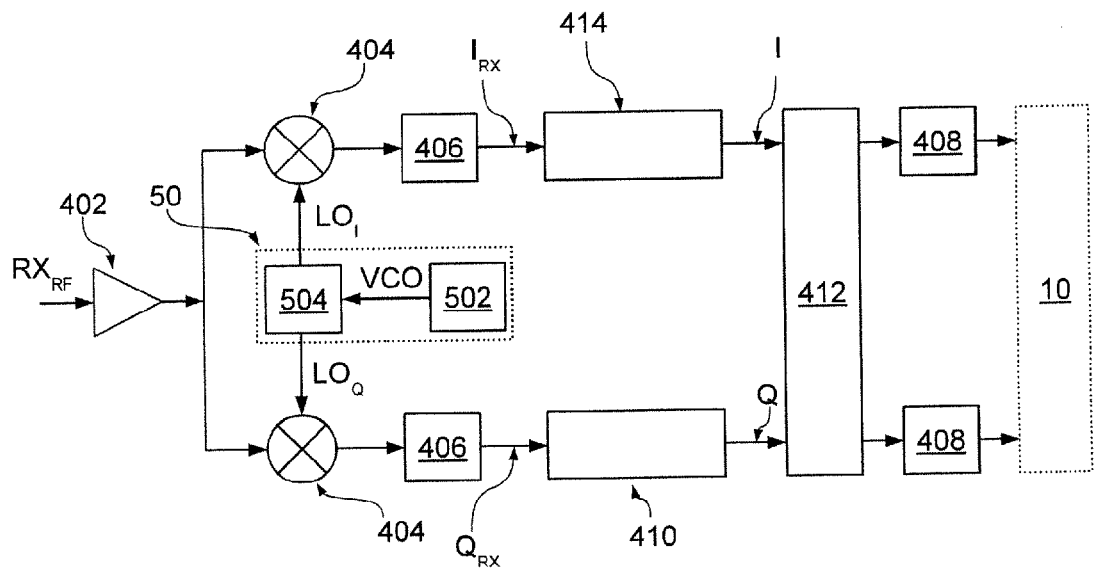

In this embodiment, as shown in FIG. 6b, it will be possible to assign exclusively to the I (Q) path the phase-correction functions of block 414. Whereas assigned to the Q (I) path are the amplitude-correction functions of block 410, in this way processing the signals in parallel to obtain phase and amplitude correction instead of processing the signals with the two blocks cascaded, as in FIG. 6a.

Figure 7:
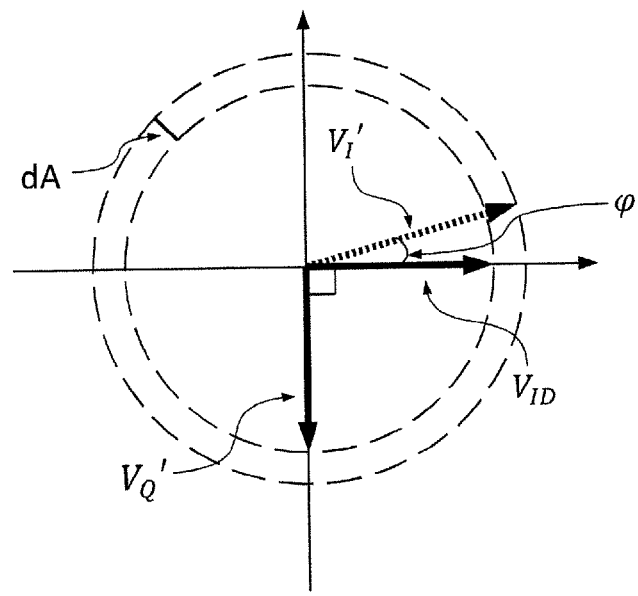
FIGS. 7, 8a, and 8b are diagrams for correction of the phase and amplitude errors in in-phase quadrature signals, according to the present disclosure.

As mentioned previously, a receiver receives at input two signals $V_I'$ and $V_Q'$, corresponding, for example, to the signals IRX and QRX of FIG. 6a, which are phase-shifted with respect to one another and have a different amplitude, as, for example, the signals illustrated in FIG. 7. In particular, the amplitude error between the two input signals, designated by dA, represents the difference between the amplitudes of the two signals $V_I'$=IRX and $V_Q'$=QRX. Designated instead by $\phi$ is the phase error, i.e., the phase shift that, for example, the first signal $V_I'$ has with respect to the ideal signal VID, or else the quadrature signal with respect to the second signal $V_Q'$. In general, it is possible to define the signals $V_I'$ and $V_Q'$ at input to the phase-correction block as:

$$V_I'=A_1\cos(wt+\phi); \text{ and} \quad (3)$$

$$V_A'=A_2\sin(wt); \quad (4)$$

where $\phi$ is the phase error, and $A_1$ and $A_2$ the amplitudes of the corresponding signals $V_I'$ and $V_Q'$.

Figures 8A, 8B:
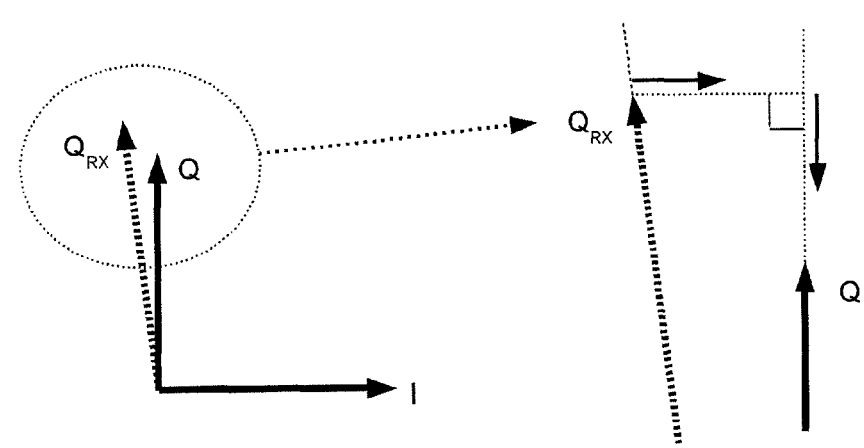

Furthermore, in general, the correction block 414 should supply at output two signals VI=I and VQ=Q that present a phase shift of 90° with respect to one another. Whereas the amplitude correction can be implemented by means of variable-gain buffers, implementation of the phase correction is more complicated. A simple procedure of such a phase and amplitude correction is described, for example, in B. McGwier, "IQ Gain and Phase Correction", San Diego, Calif., USA, Del Mar North. This includes adding to the signals I/Q appropriate fractions of the signals Q/I, as shown in FIG. 8a. FIG. 8a shows the signals in the vector space, with the signals I (in-phase) and Q (quadrature) represented in polar form.

In general, the signal QRX received may have a phase mismatch and an amplitude mismatch with respect to the expected ideal signal Q, which should be orthogonal to the signal I=IRX received and should not present amplitude mismatch. The purpose of the procedure described is to transform in successive steps the signal QRX received into the ideal signal Q.

By taking, for example, the signal I=IRX as reference, to the signal QRX received it is possible to add/subtract in a first step a small fraction of the signal I in order to obtain a signal orthogonal to the signal I, i.e. such as to present a phase shift of 90° between the latter and the signal I received. Next, a step may be envisioned in which the amplitude mismatch is corrected (see FIG. 8b). These steps can be carried out also in the reverse order.

Figure 1:
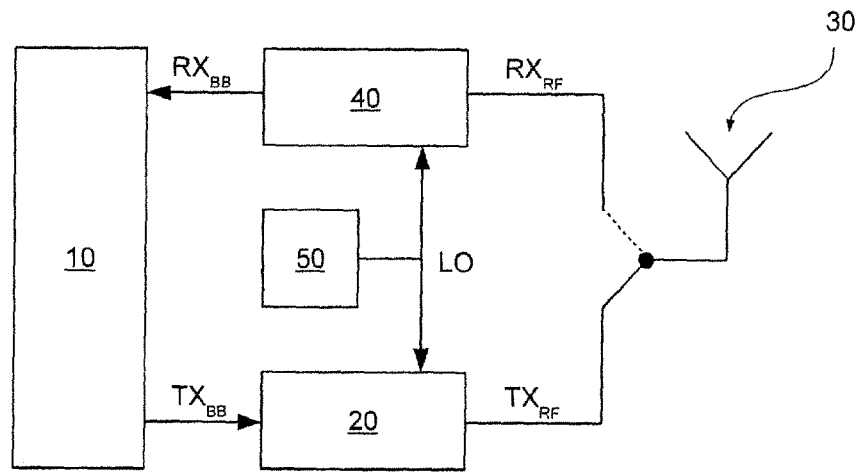
FIGS. 1-2 are schematic circuit diagrams of devices, according to the prior art.
Figure 2:
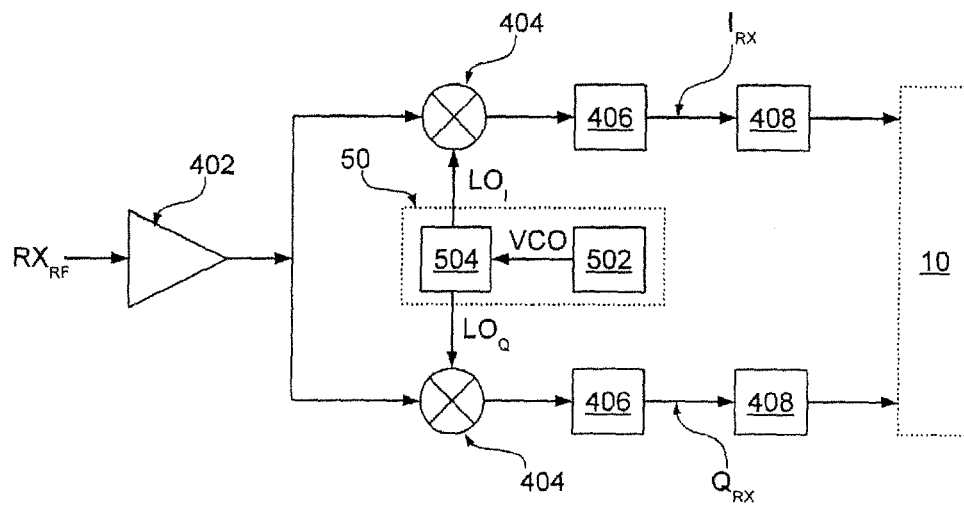
Figure 3A:
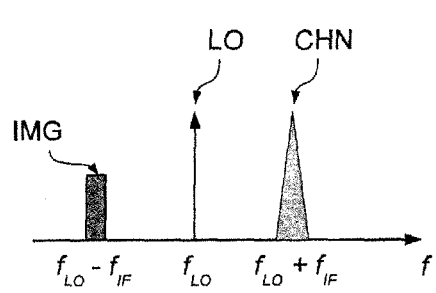
FIGS. 3a-5 are charts related to prior art approaches.
Figure 3B:
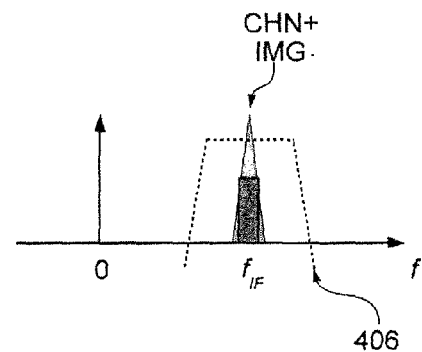
Figure 4:
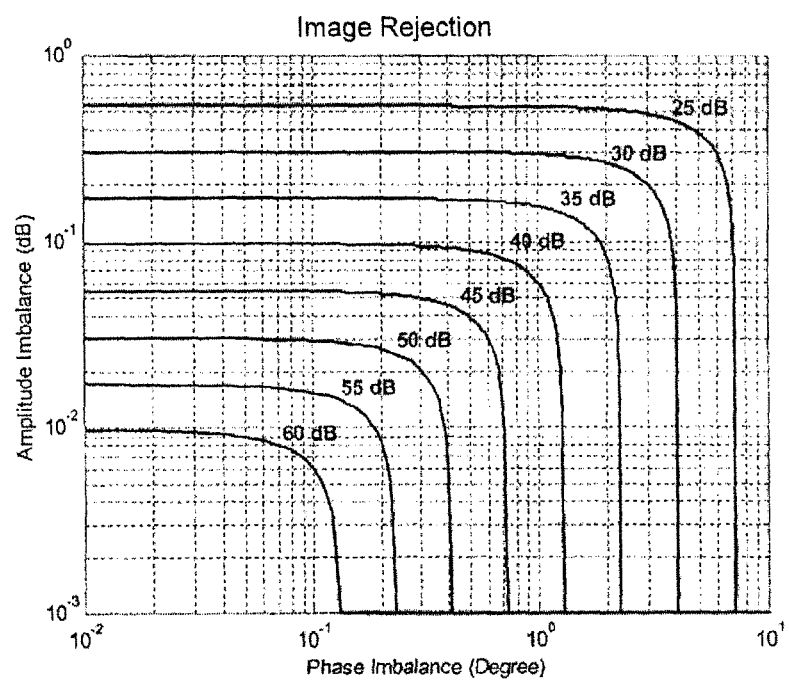
Figure 5:
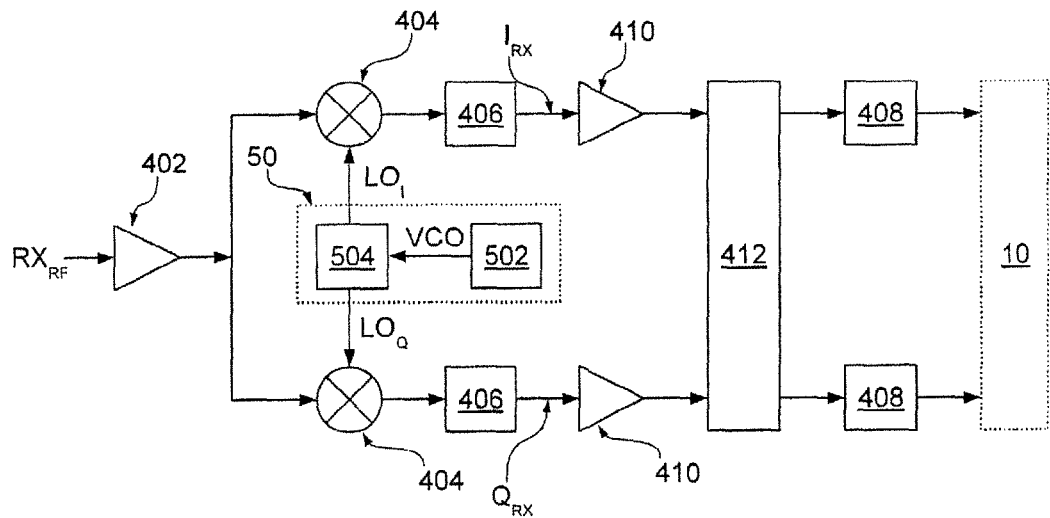

The problem of this simple approach lies in the fact that the minimum fraction of the in-phase signal I that the circuit may guarantee is strictly correlated to the resolution of the latter. To give an idea on the resolution that the blocks having the task of error compensation may guarantee, with reference to Eq. (2) and to FIG. 4, aiming at obtaining an image rejection IR higher than 50 dB, without, however, imposing constraints that may be excessively stringent from the standpoint of the phase error with respect to the amplitude error or vice versa, a maximum variation of amplitude $\delta_{max}=0.025$ dB and a maximum phase shift $\phi_{max}=0.2°$ could be fixed.

Consequently, the resolution of the two circuits should be twice the corresponding maximum error to be guaranteed, namely, $$\Delta_{max}=2\delta_{max}=0.05 \text{ dB; and} \tag{5}$$

$$\phi_{max}=2\phi_{max}=0.4°; \tag{6}$$

since, if it were greater, in the presence of an initial error $\delta$, with $\delta>\delta_{max}$ it would not be possible, in a single step, to have a final error $\delta'$ such that $|\delta'|\leq|\delta_{max}|$, i.e., to have a final error $\delta'$ that in modulus is smaller than or equal to the maximum acceptable error $\delta_{max}$. Assuming a resolution of 0.4°, with the appropriate approximations, to generate the first step of phase correction it would be necessary to guarantee a minimum gain:

$$G_{min}\approx 20 \log[\tan 0.4]\approx 20 \log[0.007]\approx -43 \text{ dB}. \tag{7}$$

This value is too low to be easily implemented at a circuit level. For example, if using a switched-capacitor (SC) adder, the gain $G_{min}$ should be implemented by a ratio of capacitances:

$$G_{min}=\frac{C_I}{C_{feedback}}=0.007; \tag{8}$$

which, assuming for $C_I$ a minimum capacitance of 100 fF, would require a capacitance $C_{feedback}$ of approximately 15 pF, and this would entail a considerable area occupation in the circuit. An alternative way of overcoming the problem is described in U.S. Pat. No. 7,570,710 B1 to Fortier et al., "In-phase and quadrature-phase signal amplitude and phase calibration," where a correction method by addition and subtraction of in-phase quadrature I/Q signals is disclosed.

Figure 9A:
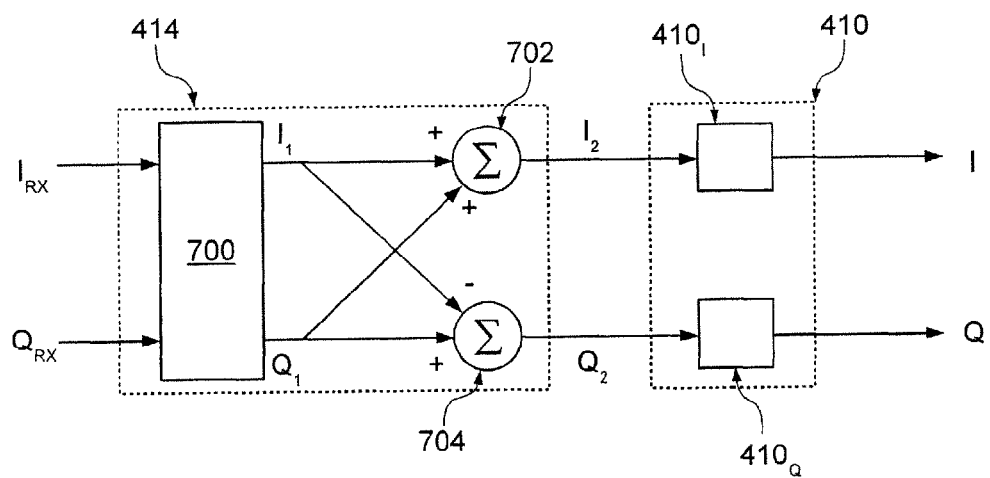
FIGS. 9a and 9b are schematic circuit diagrams for correction of the phase error and/or amplitude error in in-phase quadrature signals, according to the present disclosure.

With reference to FIG. 9a, the first amplitude-correction block 700 receives at input the signals IRX and QRX and returns at output the signals corrected in amplitude I1 and Q1. These signals I1 and Q1 at output from the first amplitude-correction block 700 are supplied at an input to two combiners or adders 702 and 704 that carry out phase correction. The adder blocks 702 and 704 return at output two signals I2 and Q2 computed respectively as:

$$I_2=I_1+Q_1; \text{ and} \tag{9}$$

$$Q_2=Q_1-I_1. \tag{10}$$

In particular, the blocks 700, 702, and 704 represent a possible implementation of the block 414 of FIG. 6. It may be shown that, given two signals with the same amplitude obtained via a compensation block 700 and with a certain phase error or mismatch with respect to the ideal 90°, the signals resulting respectively from their sum (block 702) and from their subtraction (block 704) will be phase-shifted exactly through 90° with respect to one another but will differ in amplitude. Consequently, the above amplitude error must be corrected by block 410. In particular, the signals I2 and Q2 are supplied at input to the second amplitude-correction block 410, which returns at output the signals I and Q appropriately corrected.

In more detail, in the illustrated embodiment, the block 410 comprises two variable-gain buffers, which correspond to the sub-blocks 410I and 410Q of FIG. 6. In general, the blocks 700 and 410 are amplitude-correction blocks, which may be obtained, for example, via two variable-gain buffers, which are able to vary their gains independently.

This method hence may require two distinct amplitude-correction blocks, one prior to phase correction for satisfying the hypothesis of equal amplitude of the two input signals IRX and QRX and a final block for rendering again the phase-corrected signals I2 and Q2 equal in amplitude. Hence, two sub-blocks 410I and 410Q may be necessary for each of the two I and Q paths.

Another approach that makes it possible to overcome the problems presented in the paper by B. McGwier, "IQ Gain and Phase Correction," where the gains are strictly correlated to the absolute correction of the individual I and Q signals, without having redundancies from the standpoint of amplitude correction as in U.S. Pat. No. 7,570,710 to Fortier et al., "In-phase and quadrature-phase signal amplitude and phase calibration," is described in Patent Cooperation Treaty (PCT) Application No. WO 2013/005203 to Suissa et al., "Apparatus and Method for Correcting IQ Imbalance," where a mechanism of relative correction, rather than absolute correction, is used. Specifically, with reference to the block dedicated to phase correction of only the signal I (see FIGS. 9b and 11a), the latter signal I is added to and subtracted from two different fractions of the signal Q received so as to supply at output a signal I that is appropriately phase-shifted.

Figure 9B:
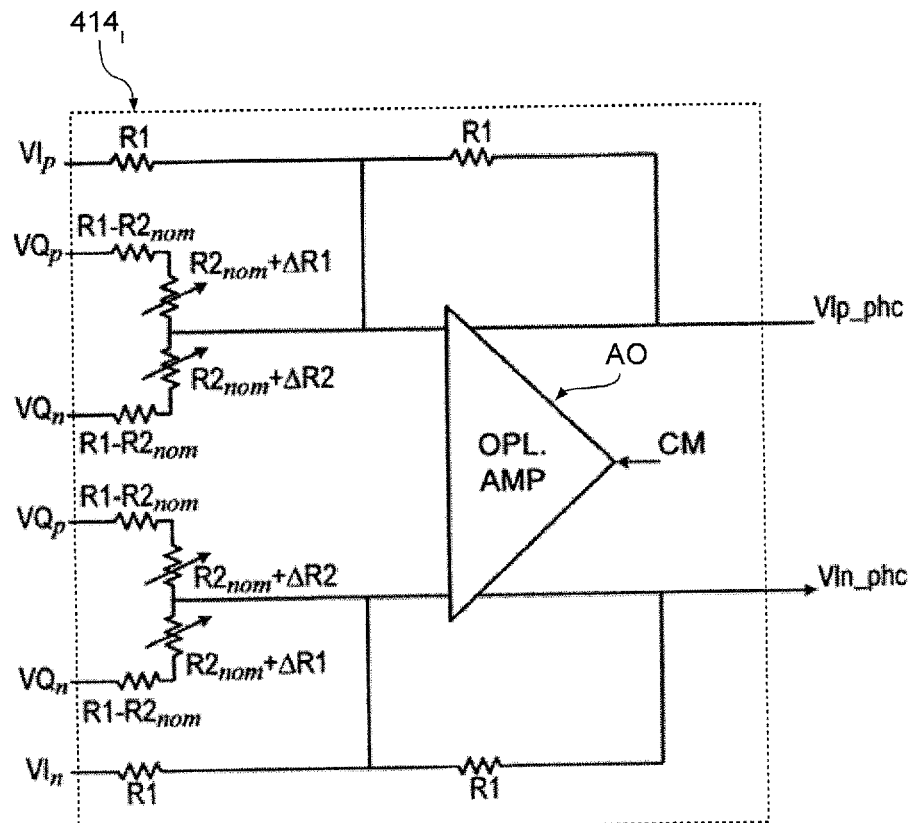

With reference to FIG. 9b, which represents the solution proposed in Suissa et al., an example of embodiment of one of the two sub-blocks of block 414 is illustrated, in particular a block represented in a differential form. For example, FIG. 9b illustrates a possible embodiment of the sub-block 414I of FIG. 6, i.e. the sub-block provided on the path of the in-phase signal. In particular, the phase-correction circuit along the path of the in-phase signal I receives at input a positive in-phase signal VIp, and a negative in-phase signal VIn, a positive quadrature signal VQp and a negative quadrature signal VQn.

Through the resistive dividers, which envision static and variable (or dynamic) resistances, the signals VIp, VIn, VQp and VQn at input to an operational amplifier AO are transformed into in-phase corrected signals, positive VIp-corr and negative VIn-corr, respectively. In this way, since the correction is produced by addition and subtraction of two different fractions, the minimum gain that the circuit must be able to guarantee will no longer be linked to the resolution of the circuit but will become an additional degree of freedom available to the designer. This approach may eliminate the need for adopting the variable-gain buffer 410 (see FIG. 9a) both before and after phase correction, there being required only one for each of the two branches I and Q, instead of two for each branch.

The problem of the latter technique lies, however, in the number of inputs of the phase-correction block, i.e., three for each of the two blocks I and Q, of which two present variable components that affect the level of complexity of the system. In fact, on the path for calculation of the signal I, the signals VIp and the two different, positive and negative fractions VQp and VQn of the signal Q, are used.

An embodiment may be based upon a mechanism of relative correction that uses only two input signals for each block instead of the three of the approach proposed in Suissa et al. Furthermore, with two fewer variable components, the method also makes it possible to include in its final embodiment the amplitude correction in addition to the phase correction.

Figure 11A:
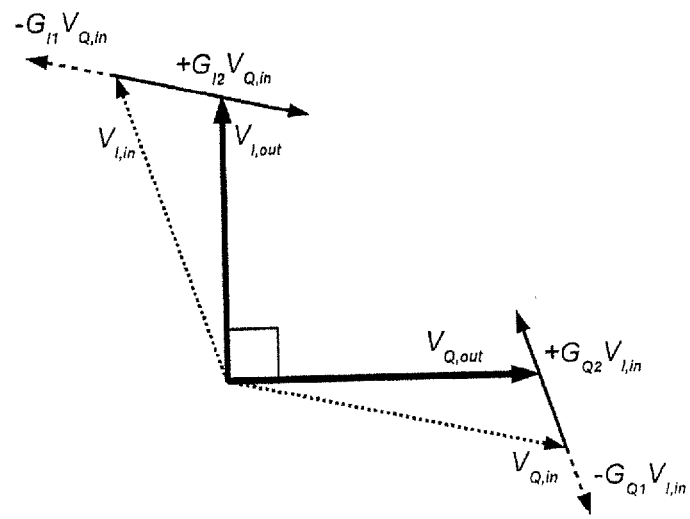
FIGS. 11a and 11b are vector diagrams referring, respectively, to a prior art technique and to an embodiment, according to the present disclosure, for correction of the phase error.

In order to highlight more clearly the differences between the method disclosed herein and the method disclosed in Suissa et al., shown in the vector diagram of FIG. 11a is the phase correction of the input signals VI,in and VQ,in in the case of the approach in the document. In this approach, in order to obtain the corrected output signal VI,out, starting from the input signal VI,in, first a "larger" portion of the signal VQ,in is added (i.e., GI2VQ,in) and then a "smaller" portion of the signal VQ,in (i.e., GI1VQ,in) is subtracted in such a way that the resulting added amount is equal to a small portion of the signal VQ,in. Since two positive and negative portions of the input signal VQ,in are used along the path of the in-phase signal VI, the phase correction can be obtained with two gain factors GI1 and GI2 chosen as desired, hence sufficiently large as to be implemented easily, thus perhaps eliminating the problem of adding a small portion of signal VQ,in (i.e., of implementing a small gain).

In a similar way, in order to obtain the corrected output signal VQ,out, starting from the input signal VQ,in first a "larger" portion of the signal VI,in (i.e., GQ2VI,in) is added, and then a "smaller" portion of the signal VI,in (i.e., GQ1VI,in) is subtracted in such a way that the resulting added amount will be equal to a small portion of the signal VI,in. Since two positive and negative portions of the input signal VI,in are used along the path of the quadrature signal VQ, also in this case the phase correction can be obtained with two gain factors GQ1 and GQ2 chosen as desired, hence sufficiently large as to enable easy implementation, thus perhaps eliminating the problem of adding a small portion of signal VI,in (i.e., of implementing a small gain).

In conclusion, in the approach disclosed in Suissa et al., instead of phase-shifting the input signal VI,in through a required angle φ, in order to render the two signals received orthogonal, a phase shift of φ+φoffset is initially produced, and then a phase shift is produced in the opposite direction through an angle φoffset, thus making it possible to avoid the problem on the minimum gain that is to be guaranteed, but introducing a certain degree of complexity at input.

In the embodiment disclosed herein, the concept of offset is extended to the correction on the two signals I and Q, in this way correlating correction of the signal I with correction of the signal Q. This approach will enable minimization of the complexity of the overall system, perhaps eliminating any type of redundancy, as will be described in greater detail hereinafter. Specifically, the common offset is this time present directly in the phase shifts produced on the signals I and Q, which are phase-shifted by adding to each of them only one signal having, as in the previous case, an amplitude that is as large as desired.

Figure 11B:
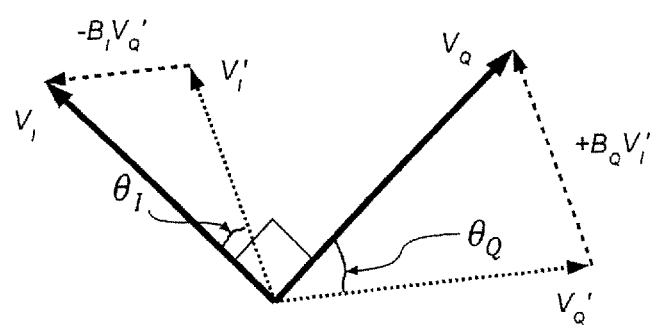

As shown in FIG. 11b, to obtain the output signal VI,out, starting from the input signal VI,in, a portion of the signal VQ,in (i.e., BIVQ,in) is subtracted, whereas to obtain the output signal VQ,out, starting from the input signal VQ,in, a portion of the signal VI,in (i.e., BQVI,in) is added. The relative magnitude of the two portions depends upon the extent and sign of the phase error to be corrected, with a common offset that this time is hence present between the corrections in I and in Q instead of being confined to the two individual branches as in WO 2013/005203 to Suissa et al. Also, in this case, the phase offset, and hence the gain offset, becomes an additional degree of freedom available to the designer.

Figure 12:
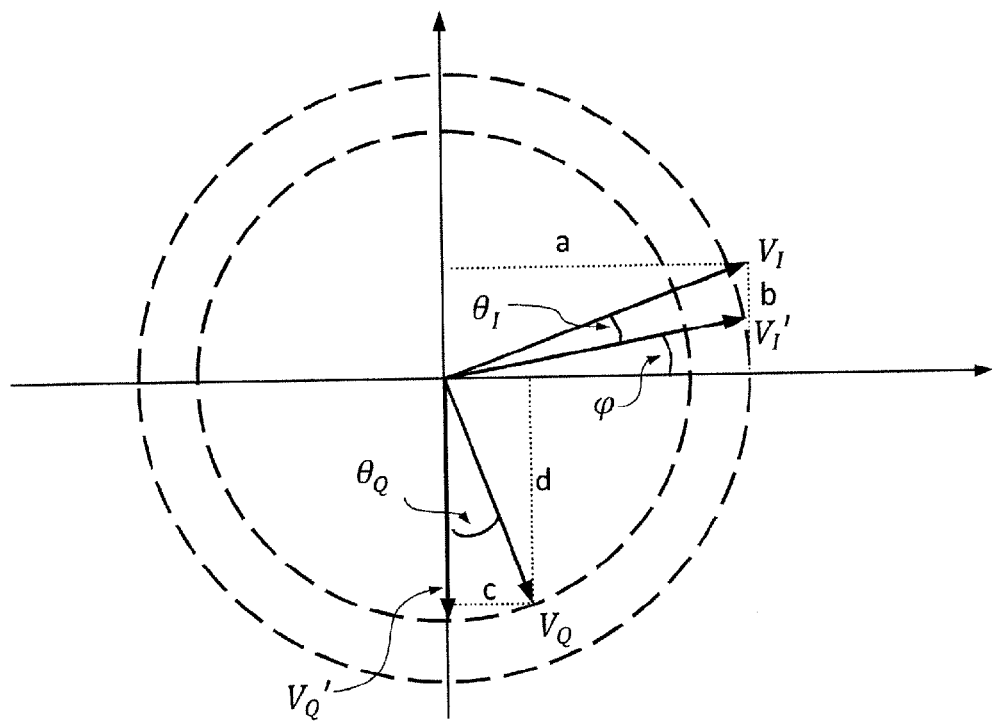
FIGS. 12, 13, and 15 are diagrams of correction of the phase error with the circuit of FIG. 10.

To enter into specifics regarding the embodiment considered, with reference to the vector diagrams of FIG. 11b and FIG. 12, both of the signals $V_I'$ and $V_Q'$ are processed in such a way that the resulting signals correspond to:

$$V_I = V_I' - B_I V_Q'; \text{ and} \tag{11}$$

$$V_Q = V_Q' + B_Q V_I'. \tag{12}$$

Figure 10:
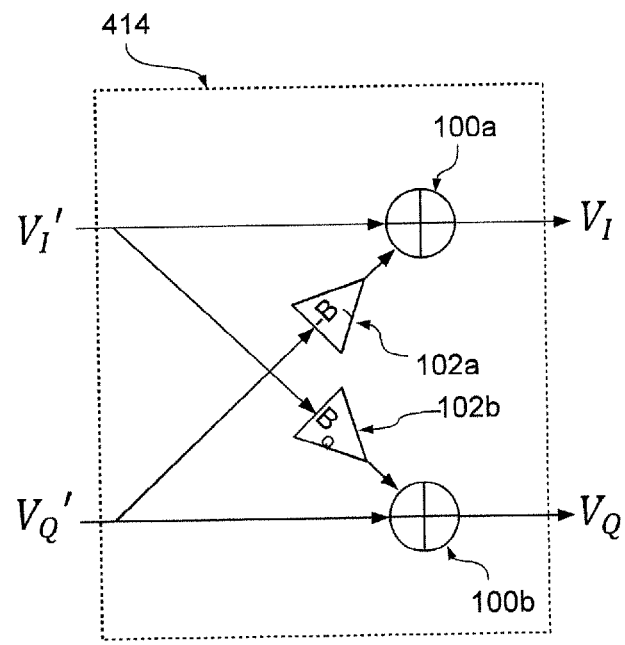
FIG. 10 is a diagram of an embodiment of a circuit for correction of the phase error, according to the present disclosure.

For example, as shown in FIG. 10, Eq. (11) can be implemented via an amplifier 102a that multiplies the signal $V_Q'$ by the amplification coefficient $-BI$ and an adder 100a that combines the signal $V_I'$ with $-B_I V_Q'$. Likewise, Eq. (12) can be implemented via an amplifier 102b that multiplies the signal $V_I'$ by the amplification coefficient BQ and an adder 100b that combines the signal $V_Q'$ with $B_Q V_I'$. Consequently, by setting the amplification coefficients BI and BQ appropriately, a phase shift of 90° at output can be achieved. As shown in FIG. 12, the output signals can be defined generically via the geometrical relations:

$$V_I = a \cos(wt) - b \sin(wt); \text{ and} \tag{13}$$

$$V_Q = c \cos(wt) + d \sin(wt). \tag{14}$$

Consequently, by combining Eqs. (11) and (12) with Eqs. (13) and (14), it is possible to define the parameters a, b, c, and d as follows:

$$a = A_1 \cos(\phi); \tag{15}$$

$$b = A_1 \sin(\phi) + B_I A_2; \tag{16}$$

$$c = B_Q A_1 \cos(\phi); \text{ and} \tag{17}$$

$$d = A_2 - B_Q A_1 \sin(\phi). \tag{18}$$

With reference to FIG. 12, it is possible to express the phase shifts produced on the signals present on the branches I and Q via the following relations:

$$\theta_I = \tan^{-1} \frac{b}{a} - \varphi; \text{ and} \tag{19}$$

$$\theta_Q = \tan^{-1}\frac{c}{d}. \qquad (20)$$

Consequently, there remains the problem of determining the right pair of gain factors BI and BQ that satisfies the expression:

$$\theta_Q - \theta_I = \phi; \qquad (21)$$

as better expressed in the phasor diagram of FIG. 12. In various embodiments, the link between the gain factors is expressed as follows:

$$B_I = G_0 + m\Delta G; \text{ and} \qquad (22)$$

$$B_Q = G_0 - n\Delta G; \qquad (23)$$

where n and m are relative integers that can vary, independently of one another, in the following interval:

$$\left[-\frac{N}{2}, \frac{N}{2} - 1\right];$$

where N is the number of gain levels, and ΔG the gain step or resolution.

Figure 13:
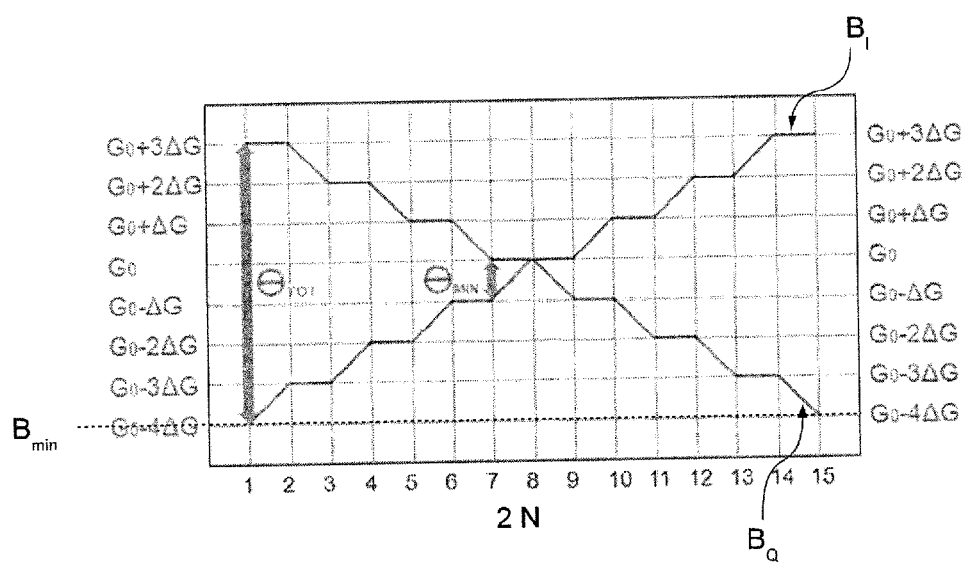

FIG. 13 shows an example of plot of the pair BI and BQ as the 2N levels of the system corresponding to the various pairs (BI, BQ) vary, in the case of N=8. In FIG. 13, ΘTOT and ΘMIN are the phase shifts produced by the differences of gain.

As already mentioned, the rejection ratio IR is strictly correlated to the phase error (φ) and amplitude error (δ). A control mechanism enables the system to settle autonomously on the pair (BI, BQ) that maximizes the IR. This is possible thanks to the monotony (linearity) of the curve that links the IR to the number of levels for the phase error and to the number of levels for the amplitude error. The value G0 generates the common phase-shift offset to be applied to the two input signals $V_I'$ and $V_Q'$, and is to be chosen taking into account that: an excessively small value renders $B_{min}$, or in general the minimum gains for $B_I$ and $B_Q$, i.e., $B_{(I,min)}$ and $B_{(Q,min)}$, too small to be easily implemented (see FIG. 13); and an excessively large value renders the phase shift produced less sensitive to the variations of gain as the level increases, these being linked by a tangent relationship (B≈tan(θ)).

Figure 14:
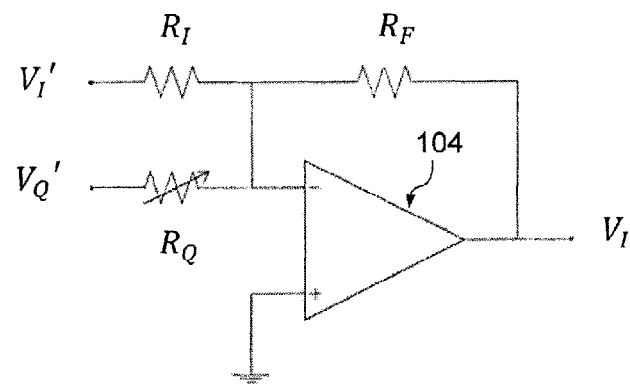
FIGS. 14, 17, and 18 illustrate some embodiments of the adders used in the circuit for correction of the phase error of FIG. 10.

With reference to FIG. 14, a possible circuit implementation of blocks 100 and 102 of FIG. 10 will now be described, such as, for example, the blocks 100a and 102a used for generation of the signal VI. In particular, in the embodiment considered, an analog adder is used. For example, as shown in FIG. 14, such an adder can be obtained with an operational amplifier 104 in inverting mode.

In particular, in the illustrated embodiment, the circuit comprises a feedback resistance RF between the output terminal and the inverting terminal of the operational amplifier 104. The circuit further comprises respective input resistances RI and RQ for the signals $V_I'$ and $V_Q'$, i.e., the signals $V_I'$ and $V_Q'$ are connected together to the negative terminal of the operational amplifier 104 through the respective resistances RI and RQ. For example, by sizing the resistance RI=RF, it is possible to write the following relation:

$$V_I = -R_F\left(\frac{V_I'}{R_I} + \frac{V_Q'}{R_Q}\right) = -V_I' - \frac{R_F}{R_Q}V_Q' = -V_I' - B_I V_Q'. \qquad (24)$$

Consequently, in the embodiment considered, the coefficient BI can be set by regulating the value of the resistance RQ, and, by inverting appropriately the input signals $V_I'$ and $V_Q'$, it is possible to obtain the output signal VI as shown in Eq. (11). In a similar way, it is possible to implement also Eq. (12) for the quadrature branch Q, for example, by sizing the resistance RQ=RF and setting the coefficient BQ by regulating the value of the resistance RI.

In general, once the correction of the phase has been carried out the amplitude error is subsequently corrected, as shown in FIG. 6a, via a subsequent stage 410 comprising, for example, a variable-gain amplifier for each branch I and Q. It would also be possible to include directly the amplitude correction, by replacing the feedback resistance RF of the branch I and/or Q with a variable resistance, in this way regulating the amplification coefficient of the respective operational amplifier 104.

However, it has been noted that, by varying the resistance RF, the gain steps for phase correction that are produced by the block being examined would be adversely affected to a considerable extent. For this reason, in one embodiment, phase correction is uncorrelated, i.e., separated, from amplitude correction, without additional costs and without worsening the levels of performance achieved. With reference to Eqs. (22) and (23), it is possible, in fact, to fix the parameters:

$$m \in [-N, N-1] \rightarrow B_I = G_0 + m\Delta G; \text{ and} \qquad (25)$$

$$n = n_{cos\,t} \rightarrow B_Q = G_0 - n_{cos\,t}\Delta G. \qquad (26)$$

The parameter n in this case becomes fixed for the system, and ncost is a generic value thereof. If the expected errors show a propensity of the system to present errors asymmetrical with respect to zero (for example, it is more likely to find phase shifts greater than 90° than less than 90°), ncost will have to be fixed in order to take into account the asymmetry; otherwise, n=0. With n=ncost, it is hence possible to manage a further degree of freedom that can be adapted on the basis of any possible lack of symmetry on the range of the expected error.

Figure 15:
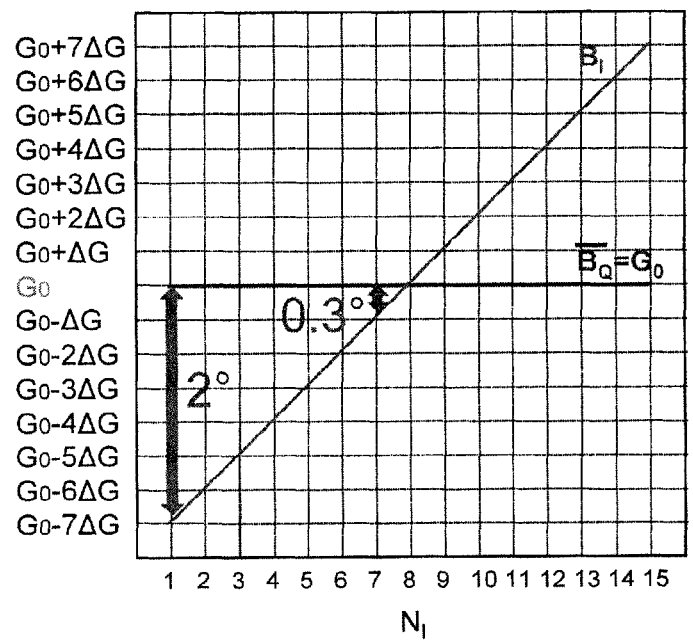

Hence, with n fixed and m variable, the correction block present along the path of the in-phase signal I will carry out phase correction, whereas the correction block present along the path of the quadrature signal Q will produce a fixed phase shift in terms of phase correction and will carry out exclusively amplitude correction. In particular, with respect to the graph of FIG. 13, in the graph of FIG. 15, which shows a simplified example useful only for the purposes of a deeper understanding, a gain factor EQ is hence found represented by a straight line parallel to the axis of the levels the height of which depends upon the value ncost.

In this way, unlike what is illustrated schematically in FIG. 6a, where the signals IRX and QRX along the two respective paths are processed by two cascaded blocks to obtain two output signals I and Q corrected both in phase and in amplitude, the signals IRX and QRX are processed in such a way as to correct in parallel the phase shift and the amplitude of the signals (FIG. 6b), thus improving the global level of compactness.

Figure 16:
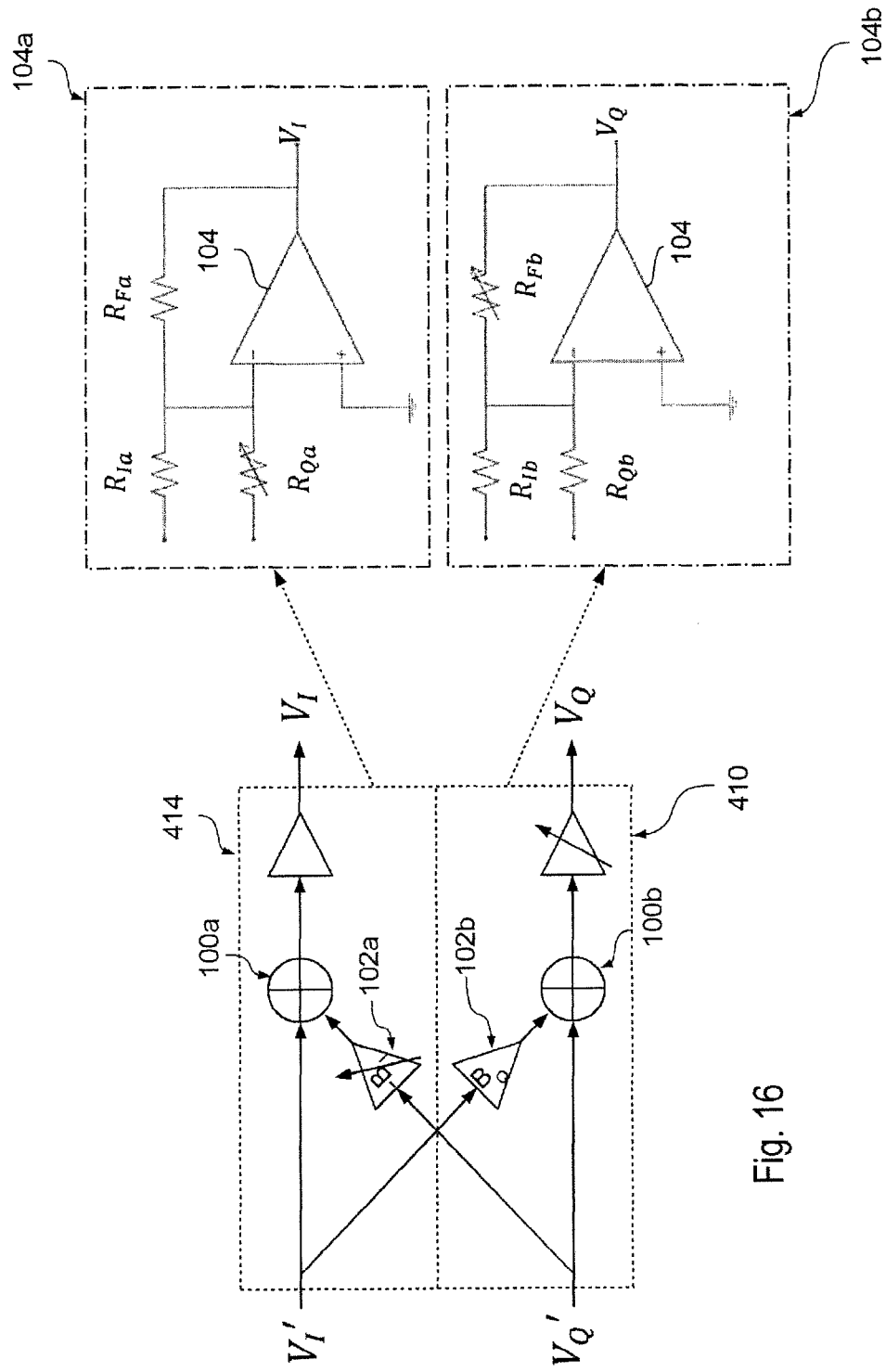
FIG. 16 illustrates an embodiment of the system for correction of the phase and amplitude errors in in-phase quadrature signals, according to the present disclosure.

FIG. 16 shows an embodiment of the entire correction system. In the embodiment considered, the branch I comprises an adder 104a with a fixed feedback resistance RFa, a fixed input resistance RIa for the signal $V_I'$, and a variable input resistance RQa for the signal $V_Q'$. Instead, the branch Q has a similar general architecture. However, in this case, the branch Q comprises an adder 104b with a variable feedback resistance RFb, a fixed input resistance RIb for the signal $V_I'$, and a fixed input resistance RQb for the signal $V_Q'$. Consequently, whereas the path of the in-phase signal I carries out phase correction, the path of the quadrature signal Q carries out amplitude correction by a variable feedback component RFb, so as to have at output:

$$V_I = -R_{Fa}\left(-\frac{V_I'}{R_{Ia}} + \frac{V_{QS'}}{R_{Qa}}\right) = \frac{R_{Fa}}{R_{Ia}}V_I' - \frac{R_{Fa}}{R_{Qa}}V_Q'; \text{ and} \quad (27)$$

$$V_Q = -R_{Fb}\left(-\frac{V_I'}{R_{Ib}} - \frac{V_Q'}{R_{Qb}}\right) = \frac{R_{Fb}}{R_{Ib}}V_I' + \frac{R_{Fb}}{R_{Qb}}V_Q'; \quad (28)$$

where the resistances $R_{Ia}$, $R_{Fa}$, $R_{Ib}$ and $R_{Qb}$ are fixed, and the resistances $R_{Qa}$, $R_{Fb}$ are variable.

As mentioned previously, in various embodiments, the resistances RIa and RQb are equal to RFa, whereas the resistance RIb is to be chosen according to ncost. In various embodiments, in the conditions of symmetry on the range of the expected error, i.e., when it is possible to choose n=0, the value of the resistance RIb corresponds approximately to the mean value of the variable resistance RQa. In this way, it is possible to obtain an accurate correction of the two signals I and Q both in phase and in amplitude using only two adders with only one variable component for each of the two paths.

The technique described herein will hence enable correction of the phase error by acting only on the path of the in-phase signal I and of the amplitude error by acting only on the path of the quadrature signal Q without any need to resort to a specific block for correction of the amplitude and using only two variable components, i.e., simplifying the inputs. In general, the approach described herein can also be adapted for correcting the phase error by acting on the path of the quadrature signal Q and the amplitude error by acting on the path of the in-phase signal I.

In general, the approach described herein can also be applied to differential signals, i.e., an in-phase signal supplied through two terminals $V_{IP}'$ and $V_{IN}'$, and a quadrature signal supplied through two terminals $V_{QP}'$ and $V_{QN}'$. In this case, also the output signal supplied by the adder can be made available through two terminals, such as, for example, $V_{IP}$ and $V_{IN}$ for the adder 104a or $V_{QP}$ and $V_{QN}$ for the adder 104b.

Figure 17:
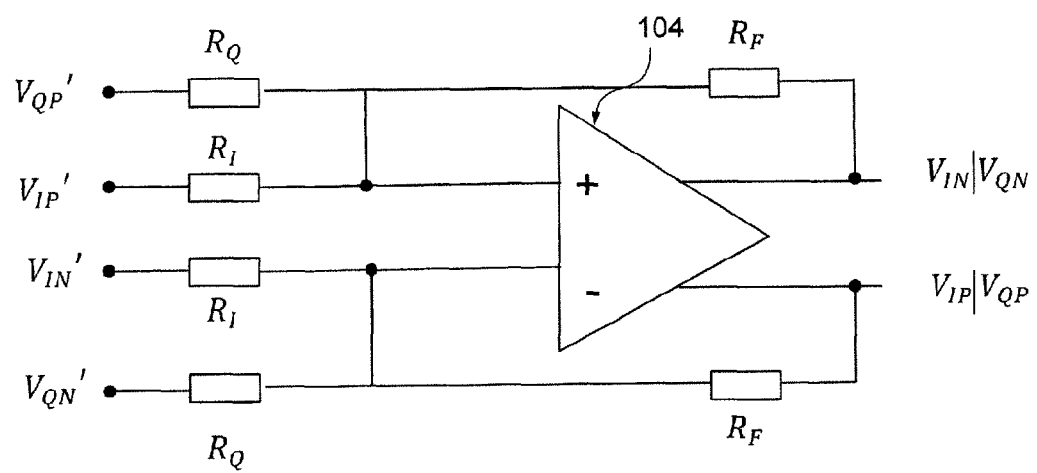

For example, as shown in FIG. 17, in an adder based upon a differential amplifier, the terminals $V_{IP}'$ and $V_{QP}'$ are connected through respective resistors RI and RQ to the positive terminal of the amplifier. Furthermore, the negative differential output ($V_{IN}$ or $V_{QN}$) of the amplifier is connected through a feedback resistor RF to the positive terminal of the amplifier. Likewise, the terminals $V_{IN}'$ and $V_{QN}'$ are connected through respective resistors RI and RQ to the negative terminal of the amplifier. Furthermore, the positive differential output ($V_{IP}$ or $V_{QP}$) of the amplifier is connected through a feedback resistor RF to the negative terminal of the amplifier.

Consequently, also in this case, the resistors RI or the resistors RQ are variable for the adder that carries out phase correction, and the resistors RF are variable for the adder that carries out the amplitude correction. Also, for differential signals, it is possible to obtain an accurate correction of the two signals I and Q both in phase and in amplitude using only two adders with only four variable components in all. For example, the resistors with variable resistance may be provided via a plurality of resistors with fixed resistance and respective switches that are configured for connecting one or more of these resistors in series and/or in parallel.

Furthermore, since the gain steps are very close to one another and the circuit should be insensitive to the errors of tolerance of the components, in some embodiments, the switched-capacitor (SC) technique may be used for implementing the resistances mentioned above, i.e., the resistances RQ, RI and RF, with capacitors and switches. The above differential adders based upon the switched-capacitor (SC) technique are known in the art, which renders any detailed description unnecessary. For example, with reference to correction of the phase error, a possible implementation of the adder is represented in FIG. 18 for differential signals.

Figure 18:
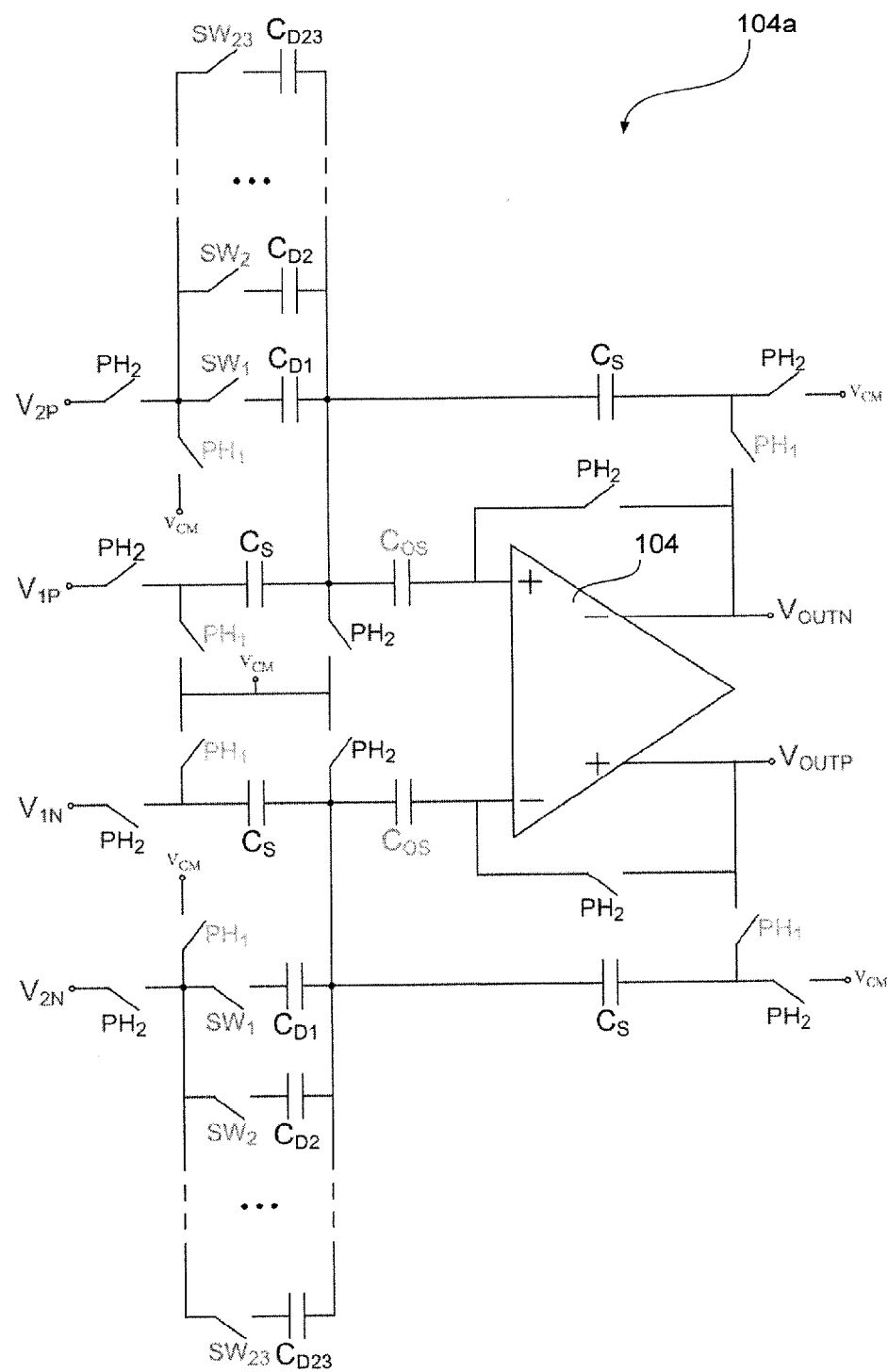

In particular, FIG. 18 shows a possible embodiment, for example, of the block on the top right in FIG. 16, i.e., the block 104a. Basically, the signal V1 supplied through two differential terminals V1P and V1N, which corresponds for example to the signal $V_I'$, is connected through respective fixed capacitances CS to the positive and negative terminals of the differential amplifier 104.

Instead, the signal V2 supplied through two differential terminals V2P and V2N, which corresponds for example to the signal $V_Q'$, is connected through respective variable capacitances CD to the positive and negative terminals of the differential amplifier 104. For example, in the embodiment considered, this capacitance CD may be set via a connection in parallel of a plurality of capacitors, such as, for example, 23 capacitors CD1, CD2, . . . CD23 that can be activated selectively, for example, through respective switches SWD1, SWD2, . . . SWD23. The values of the capacitors CDi may be chosen in a set of twenty-three different capacitances, starting, in the case under examination, from the value of 110 fF up to the maximum value of 231 fF, with variation steps of 5.5 fF, a precision that guarantees a phase step of less than 0.3°. Furthermore, it is possible to extend the number of levels, for example, up to 64, by simply combining in parallel two or more of the twenty-three capacitances so as to obtain therefrom one of a higher value. Finally, fixed feedback capacitors CF are provided along the feedback paths of the differential amplifier 104.

The person skilled in the art will appreciate that this circuit may comprise also further switches PH1 and PH2 that serve for operation of the switched-capacitor technique, and further optional capacitors, such as, for example, the capacitors COS useful for the purposes of offset compensation.

Consequently, in the case where the capacitance CS is equal to CF, the adder implements the following equation:

$$V_0 = V_1 + B_i V_2 \quad (29)$$

where $$B_i = \frac{C_D}{C_F}. \quad (30)$$

In this case, the weighting coefficients of the adder 104a are implemented by ratios between the capacitances, enabling a precision of the order of 0.1% to be obtained. For example, in the embodiment of FIG. 18, the following gain factors for the first and last step will be obtained:

$$B_1 = \frac{C_{D1}}{C_F} = 0.1 \to -20 \text{ dB; and}$$

$$B_{64} = \frac{C_{D1} + C_{D2} + C_{D23}}{C_F} = 0.415 \to -7.6 \text{ dB.}$$

Likewise, correction of the amplitude may be obtained by providing the adder 104b, introducing a variable capacitance CF instead of the fixed capacitance shown in FIG. 18, for example, using a plurality of capacitors CFi and respective switches SW (as shown in FIG. 18 for the capacitances CD). In this case, the variable capacitances CD that comprise a plurality of capacitors CDi may be replaced with a fixed capacitance.

In summary, in various embodiments described previously, the correction circuit comprises two analog adders, including, respectively, an operational amplifier. Each of the adders computes the following equation:

$$V_{out} = x \cdot (y \cdot V_1 + z \cdot V_2)$$

Consequently, both of the adders compute a sum of two input signals V1 and V2 weighted with the coefficients y and z. For example, for a receiver, the signals V1 and V2 correspond to the signal received $V_I'$ and $V_Q'$ and the coefficients y and z can be set via the resistors RI and RQ, or capacitors CS and CD. Finally, the adder multiplies the result by the coefficient x. For example, this coefficient may be set via the resistor RF or the capacitor CF.

In various embodiments, the first adder is configured for carrying out a phase correction. For this purpose, one of the coefficients y or z is variable, and the other coefficient and the coefficient x are preferably fixed. For example, as described previously, the value of the resistor RQ or of the capacitor CD may be variable for this purpose. Instead, the second adder is configured for carrying out an amplitude correction. For this purpose, the coefficient x is variable and the other coefficients y and z are preferably fixed. For example, as described previously, the value of the resistor RF or of the capacitor CF may be variable for this purpose.

Of course, the details of construction and the embodiments may vary, even significantly, with respect to what has been illustrated herein purely by way of non-limiting example, without thereby departing from the sphere of protection, as defined by the annexed claims.

That which is claimed is:

1. A system for correction of phase and amplitude errors, the system comprising:
   first and second adders each configured to
      supply, respectively, a first output signal and a second output signal,
      compute a sum of a first input signal and a second input signal, the sum being weighted via a respective first coefficient and a respective second coefficient, and
      multiply the weighted sum by a third coefficient;
   at least one of the first coefficient and the second coefficient of said first adder configured to enable correction of the phase errors using variable phase shift in terms of phase correction and a fixed amplitude correction;
   the third coefficient of said second adder configured to enable correction of the amplitude errors with a fixed phase shift in terms of phase correction and a variable amplitude correction.

2. The system according to claim 1 wherein the at least one of the first coefficient and the second coefficient of said first adder is variable to enable the correction of the phase errors; and wherein the third coefficient of said second adder is variable to enable the correction of the amplitude errors.

3. The system according to claim 1 wherein each of said first and second adders comprises an amplifier in an inverting mode; and wherein the first and second output signals are supplied by said respective amplifiers.

4. The system according to claim 1 wherein the first coefficient, the second coefficient, and the third coefficient are set via at least one of a resistor and a capacitor according to a switched-capacitor technique.

5. The system according to claim 1 wherein the first input signal is a differential signal; and wherein the second input signal is a differential signal.

6. The system according to claim 1 wherein the first input signal is an in-phase signal; and wherein the second input signal is a quadrature signal.

7. The system according to claim 1 wherein the first input signal and the second input signal are baseband signals.

8. The system according to claim 1 wherein for said first adder, only one between the first coefficient and the second coefficient is variable, and the other coefficient and the third coefficient are fixed to generate the variable phase shift in terms of phase correction and the fixed amplitude correction; and wherein for said second adder, only the third coefficient is variable, and the first coefficient and the second coefficient are fixed to generate the fixed phase shift in terms of phase correction and the variable amplitude correction.

9. A receiver system comprising:
   a receiver circuit; and
   an error correction circuit coupled to said receiver circuit and for phase and amplitude correction, the error correction circuit comprising
      first and second adders each configured to
         supply, respectively, a first output signal and a second output signal,
         compute a sum of a first input signal and a second input signal, the sum being weighted via a respective first coefficient and a respective second coefficient, and
         multiply the weighted sum by a third coefficient;
      at least one of the first coefficient and the second coefficient of said first adder configured to enable correction of the phase errors using variable phase shift in terms of phase correction and a fixed amplitude correction;
      the third coefficient of said second adder configured to enable correction of the amplitude errors with a fixed phase shift in terms of phase correction and a variable amplitude correction.

10. The receiver system according to claim 9 wherein the at least one of the first coefficient and the second coefficient of said first adder is variable to enable the correction of the phase errors; and wherein the third coefficient of said second adder is variable to enable the correction of the amplitude errors.

11. The receiver system according to claim 9 wherein said system is configured to vary the first, second, and third coefficients of said first adder and of said second adder to correct the phase and amplitude errors between the first and second input signals.

12. The receiver system according to claim 9 wherein said receiver circuit is a receiver of the low-intermediate frequency type.

13. The receiver system according to claim 9 wherein each of said first and second adders comprises an amplifier in an inverting mode; and wherein the first and second output signals are supplied by said respective amplifiers.

14. The receiver system according to claim 9 wherein the first coefficient, the second coefficient, and the third coefficient are set via at least one of a resistor and a capacitor according to a switched-capacitor technique.

15. The receiver system according to claim 9 wherein the first input signal is a differential signal; and wherein the second input signal is a differential signal.

16. A method for correction of phase and amplitude errors, the method comprising:
operating each of first and second adders to
supply, respectively, a first output signal and a second output signal,
compute a sum of a first input signal and a second input signal, the sum being weighted via a respective first coefficient and a respective second coefficient, and multiply the weighted sum by a third coefficient;
setting at least one of the first coefficient and the second coefficient of the first adder to enable correction of the phase errors using variable phase shift in terms of phase correction and a fixed amplitude correction; and
setting the third coefficient of the second adder to enable correction of the amplitude errors with a fixed phase shift in terms of phase correction and a variable amplitude correction.

17. The method according to claim 16 further comprising varying the first, second, and third coefficients of the first adder and the second adder to enable the correction of the phase and amplitude errors between the first and second input signals.

18. The method according to claim 16 further comprising varying the at least one of the first coefficient and the second coefficient of the first adder to enable the correction of the phase errors, and varying the third coefficient of the second adder to enable the correction of the amplitude errors.

19. The method according to claim 16 wherein each of the first and second adders comprises an amplifier in an inverting mode; and wherein the first and second output signals are supplied by the respective amplifiers.

20. The method according to claim 16 wherein the first coefficient, the second coefficient, and the third coefficient are set via at least one of a resistor and a capacitor according to a switched-capacitor technique.

21. The method according to claim 16 wherein the first input signal is a differential signal; and wherein the second input signal is a differential signal.

* * * * *